United States Patent [19]

Ehnholm

[11] Patent Number: 5,621,322
[45] Date of Patent: Apr. 15, 1997

[54] VHF/RF VOLUME ANTENNA FOR MAGNETIC RESONANCE IMAGING INCLUDING VHF APPLICATOR AND RF COIL ARRANGED TO PROVIDE PERPENDICULAR FIELDS

[75] Inventor: Gösta J. Ehnholm, Helsinki, Finland

[73] Assignee: Picker Nordstar Inc., Helsinki, Finland

[21] Appl. No.: 401,178

[22] Filed: Mar. 9, 1995

[30] Foreign Application Priority Data

Mar. 9, 1994 [GB] United Kingdom .................... 9404602

[51] Int. Cl.⁶ ............................ G01R 33/44; G01R 33/62
[52] U.S. Cl. ............................................. 324/318; 324/316
[58] Field of Search ....................................... 324/300, 318, 324/316, 322, 307, 309, 317, 310, 311, 313, 314; 128/653.5

[56] References Cited

U.S. PATENT DOCUMENTS 4,973,908 11/1990 Bottomley et al. ...................... 324/318
5,184,076 2/1993 Ehnholm ................................. 324/318
5,357,958 10/1994 Kaufman ............................. 324/318 X

FOREIGN PATENT DOCUMENTS 2246201 1/1992 United Kingdom .

Primary Examiner—Sandra L. O'Shea
Assistant Examiner—Roger Phillips
Attorney, Agent, or Firm—T. B. Gurin; J. J. Fry

[57] ABSTRACT

A transducer for Overhauser magnetic resonance imaging comprises a cylindrical NMR coil 11 and a two part VHF applicator 12, 13. The applicator and coil are arranged such that the electric field provided by the applicator in use is substantially perpendicular to the coil wires. The VHF applicator is shaped to give a helical field in the region filled by the RF coil, and the RF coil is arranged to be a helix of the opposite handedness. The applicator can comprise a number of similar elements having an electromagnetic resonance mode whose magnetic fled couple to the imaging volume. The elements can be arranged in spirals to form an electric periodic structure.

20 Claims, 3 Drawing Sheets

VHF/RF VOLUME ANTENNA FOR MAGNETIC RESONANCE IMAGING INCLUDING VHF APPLICATOR AND RF COIL ARRANGED TO PROVIDE PERPENDICULAR FIELDS

BACKGROUND OF THE INVENTION

The present invention relates to magnetic resonance imaging (MRI), and more specifically, to Overhauser MRI (OMRI), which uses the Overhauser effect to enhance the nuclear magnetic resonance signal being received by the MRI apparatus and processed into an image. MRI is nowadays one of the most important modalities for medical diagnostic imaging, and it is described in a multitude of medical and technical textbooks. MRI is based on magnetic resonance of nuclei in magnetic fields. The resonance is manifested as an electromagnets signal, an "echo", received by the MRI apparatus as a response to an "exciting" signal, transmitted to the region to be imaged. The resonating nuclei, usually protons, have to be in a magnetic field ($B_0$) to produce the resonance. The received echo signal contains information of the spatial position of the protons thanks to gradient fields superposed on $B_0$ by gradient coils. An MRI apparatus thus typically contains means for producing the $B_0$: field, means for producing time varying gradient fields, means for transmitting and receiving electromagnetic signals at the nuclear magnetic resonance (NMR) frequency, and a master computer which operates said means sequentially to transmit and receive the NMR signals, and convert them to numbers which are mathematically interpreted and displayed as images. This automatic process is termed an "imaging sequence". MRI machines are presently commercially available from about ten different manufacturers.

The use of the Overhauser effect to enhance and modify MRI images is based on something which is also, more descriptively termed dynamic polarization, or double resonance. The quality of an MRI image is to a large extent dependant on the signal to noise ratio (s/n) of the received NMR signal. This ratio is proportional to the degree of polarization along $B_0$ of the protons (or other nuclei being imaged). The polarization, normally proportional to $B_0$, can be increased "dynamically" by a second magnetic resonance involving electrons, a "double resonance" in other words. Thus the use of the Overhauser effect implies performing a second magnetic resonance process, termed electron spin resonance (ESR), also called electron paramagnetic resonance (EPR). An OMRI instrument for producing MRI images enhanced by the Overhauser effect thus needs all the means included in a conventional MRI machine, and in addition means for transmitting the ESR signals to dynamically polarize the protons in the region of interest being imaged. To get an enhanced image one needs, furthermore, paramagnetic electrons in the region of interest. These can be provided by injecting a special contrast medium.

Machines for taking OMRI images are presently being developed and are not commercially available. A good article reviewing the present state of the art is "Proton-Electron Double Resonance Imaging of Exogeneous and Endogeneous Free Radicals in-vivo" D. J. Lurie and I. Nicholson published in: "Proceedings of International School of Physics Enrico Fermi, Course CXIII, Nuclear Magnetic Double Resonance"; Maraviglia B., ed; pub. Italian Physical Society; distr. North Holland, 1993.

A critical part of an OMRI instrument is the one closest to the patient being imaged, which emits the electromagnetic fields forming the transmitted ESR and NMR signals, and receives the NMR echo. This part, which we will call the "transducer", typically consists of a coil for the NMR signals, which oscillate in the radio frequency (RF) range, and some sort of antenna for the ESR signals, which operate in the very high frequency (VHF) range. Alternative names for the VHF antenna are resonator or applicator. At a typical field of 0.01 T the NMR frequency is about 400 kHz and the ESR frequency 300 MHz.

The present inventor has described the requirements on the VHF part in a previous application "VHF Applicator for Magnetic Resonance Imaging", GB-A-2246201. This application discloses an invention teaching how to make efficient VHF applicators based on electrical periodic structures, and discusses the requirements placed on such devices. It does not, however, address the difficulty encountered when integrating the RF and VHF parts of the complete OMRI transducer. This problem is solved by the present invention.

The requirements on the RF part of the transducer are that it should be sensitive and give even-density images from the region of interest. Technically this translates to:

Good filling factor.

Low losses, meaning a high Q-value.

It should produce a homogeneous $B_1$-field.

It should be sensitive to a rotating $B_1$-field, not an oscillating one.

The last requirement is for sensitivity: The magnetic resonance signals comprise rotating fields. An oscillating field is physically equivalent to two counterrotating fields of equal magnitude. If the system is made sensitive to an oscillating signal it will pick up signal from only one of the corresponding rotating components but noise from both of them, leading to a loss in s/n.

The requirements on the VHF applicator are that it should produce a high degree of dynamic polarization at a low level of heat dissipation in the region of interest. These two are contradictory, and the dissipated heat is a safety aspect when imaging humans and thus a very important one. Technically the requirements mean that:

The applicator should produce a rotating $B_2$-field.

It should produce as little extra electric field as possible.

It should have low losses, high Q-value.

Fair filling factor.

Homogeneous $B_2$-field.

The requirement for a rotating field, as opposed to an oscillating one, is usually more important for the VHF than for the RF signal. Eliminating the counterrotating field component means, in the former case, that the active component can be doubled (assuming that the limit is set by VHF dissipation in the patient). This increases the polarization, and thus the s/n by a factor 2. In the latter case the noise power is halved, but this increases s/n by just the square root of two. An optimal design of the applicator would place all the losses in the patient and at the same time shape the $B_2$ field in such a way so as to produce maximal polarization without exceeding the allowed level of dissipation.

The listed requirements are difficult enough to fulfil in stand-alone RF coils and VHF applicators, but when combining the two, new problems occur. To keep a good filling factor for the RF coil it is essential to place it as close as possible to the patient, otherwise much of the received signal is lost. The RF coil should thus be inside the VHF applicator. Normally, however, the RF coil is not transparent to the VHF field but tends to act as a shield. In the cited paper by Lurie and Nicholson is presented the presently best attempt to address these problems. They describe a combination of a solenoidal coil for receiving the NMR signal, surrounded by an Alderman-Grant ESR resonator. In this transducer the $B_2$-field can penetrate the NMR coil because it is perpendicular to the axis of the coil, thus the magnetic flux lines can sneak in between the coil turns.

This transducer has the following fundamental shortcomings: First, both the $B_1$- and the $B_2$-fields are oscillating rather than rotating. Second: The electric field associated with the ESR magnetic field is tangential to the wire of the NMR coil in part of the coil. The importance of rotating fields has been explained before. To understand the significance of the latter drawback we have to consider the shape of the magnetic and electric fields in the transducer. The ESR resonator is designed to give a magnetic field which is predominantly homogeneous at the NMR coil. The associated electric field will, when the NMR coil is not present, be perpendicular to the magnetic one. The electric field lines will form approximate circles around the axis going through the resonator midpoint in the $B_2$-field direction. When the NMR coil is placed in the resonator we find that it will interact with the VHF electric field: Looking at that side of the coil where the $B_2$-field is approximately perpendicular to the wires we find that, as we trace the electric field lines, they will here run tangentially to the wires for about half of their extent. Thus the electric field will induce a voltage into the NMR coil wire, causing, in turn, a current. As long as the coil is rather small, this will be tolerable. The induced voltage is balanced from the opposite side of the coil, where a voltage with equal magnitude is induced, and the currents will be local and small enough to be insignificant.

If, however, the design is scaled up, for instance to accommodate the human head, problems will come. The coil wire will have an extension of several wavelengths of the VHF signal. It will therefore support many parasitic resonant modes close to this frequency, the number growing with the length of the wire. Many of these modes will correspond to a current distribution which does not have the same phase at diametrically opposite points of the coil, this feature also increases with size. The voltages induced from the VHF field will then no longer balance, and as they couple to resonances they will induce large currents. As a result the VHF power will be absorbed and the field distorted.

SUMMARY OF THE INVENTION

According to the present invention, there is provided an OMRI transducer, comprising: a VHF applicator and an RF coil inside the applicator, wherein the applicator and coil are arranged such that the electric field provided by the applicator in use is everywhere substantially perpendicular to the coil wires.

In the present context, the term "substantially perpendicular" is intended to mean that the perpendicular field component corresponds to a much larger energy than the corresponding tangential one. This is the case if the square of the perpendicular component averaged over any half wavelength along the wire is at least one order of magnitude larger than the corresponding average of the square of the tangential component.

The arrangement of the electric field produced by the VHF applicator to be everywhere substantially perpendicular to the wires of the NMR coil ensures that the shielding of the applicator magnetic field $B_2$ by the coil is minimized. Furthermore, coupling of parasitic resonances is also avoided.

In a preferred embodiment, the VHF applicator is shaped to give a helical field in the region filled by the RF coil, and the RF coil is arranged to be a helix of the opposite handedness. At the ends of the RF coil, the applicator field helicity can end to make the electric field substantially perpendicular to the coil turns in this region.

The applicator can be made in a number of ways to produce a field of the appropriate shape. It can comprise a number of similar elements having an electromagnetic resonance mode whose magnetic field couples to the desired volume. The elements are arranged in spirals or otherwise to form an electric periodic structure.

BRIEF DESCRIPTION OF THE DRAWINGS

A preferred embodiment of the present invention will now be described by way of example only, and with reference to the accompanying drawings, in which.

DETAILED DESCRIPTION OF THE PREFERRED EMBODIMENT

Figure 1:
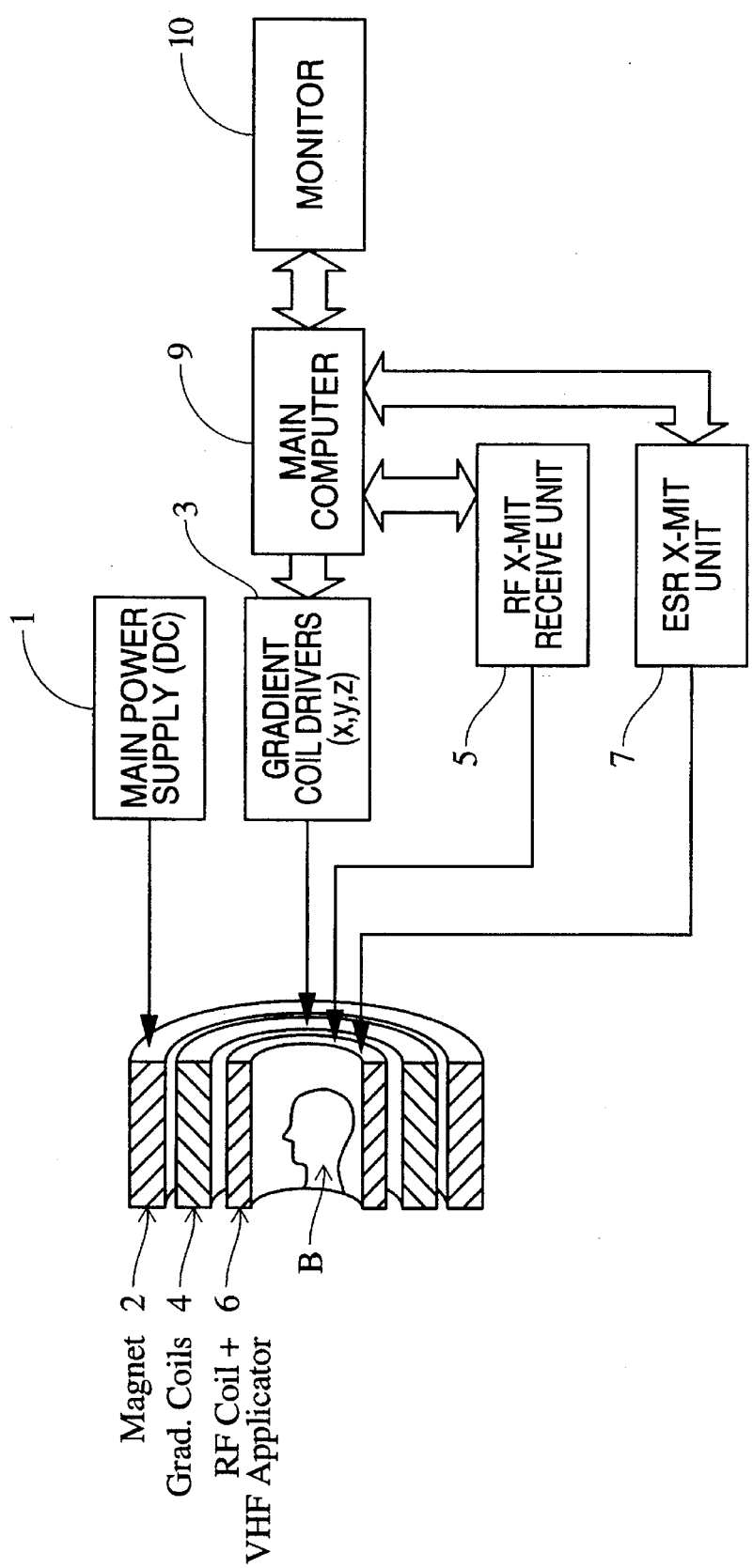
FIG. 1 shows an NMR apparatus according to the present invention.

With reference to FIG. 1, an MRI apparatus in accordance with the present invention contains a means 1, 2 for producing a constant magnetic field $B_0$ in an imaging volume 8; means 3, 4 for producing time varying gradient fields in the imaging volume: means 5, 6 for transmitting and receiving electromagnetic signals at the nuclear magnetic resonance (NMR) frequency; means 6, 7 for transmitting electromagnetic signals at an Electron Spin Resonance (ESR) frequency; and a master computer 9 which operates said means sequentially to transmit and receive the NMR signals, and convert them to numbers which are mathematically interpreted and displayed as images on a monitor 10. The present invention includes transducer 6 that is comprised of an RF coil and a VHF applicator.

Figure 2:
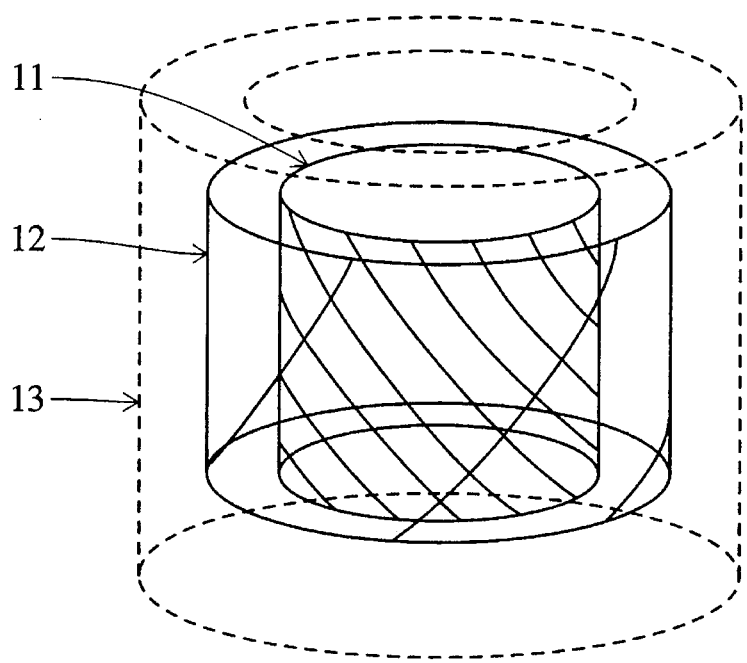
FIG. 2 shows the transducer according to the present invention.

An embodiment of the invented transducer is shown in FIG. 2. It consists of the cylindrical NMR coil 11 and the VHF applicator, which comprises parts 12 and 13. It is designed for experiments with small animals, and has useful imaging volume in the shape of a cylinder with length and diameter each equal to approximately 12 cm. The NMR coil, which is located closest to the middle of the VHF applicator, has a diameter and length each equal to 14.5 cm. It is shown separately in FIG. 3, where the cylindrical surface containing the coil has been unrolled into the plane of the paper to show the shape of the windings. The coil is preferably formed by two or three pairs sensing a $B_1$-field perpendicular to the coil axis. The Figure shows three coil pairs connected in such a way that the precessing proton magnetization will induce a three phase signal into the terminals R, S, and T, in the same way as the voltage induced by the rotor into the stator of a three-phase generator. The three-phase signal is combined in the monitoring electronics into a one-phase one, which corresponds to the used sense of rotation, by methods known in the art. If two coil pairs are used, they are placed at 90° angle to each other, and the signals are coupled using a hybrid junction to make the one-phase signal. The terminals are connected to the monitoring circuitry with wires preferably equipped with VHF traps, which will be described later below. As shown in the figures, the coil is not a simple "straight" saddle coil, with turns running along straight lines in the axial direction continuing along perpendicular circle segments, but a "twisted" one. The twisted coil can be thought as derived from the straight one by twisting it around the coil axis by approximately 90°, so that the straight part of the turns are transformed into helices.

It should be noted that this optimal angle of twist could be more than 90°, especially in the case in which the object to be imaged is longer, compared to the wavelength of the used VHF radiation in that object, than in the presently described embodiment. In principle there is no upper limit to it.

Figure 3:
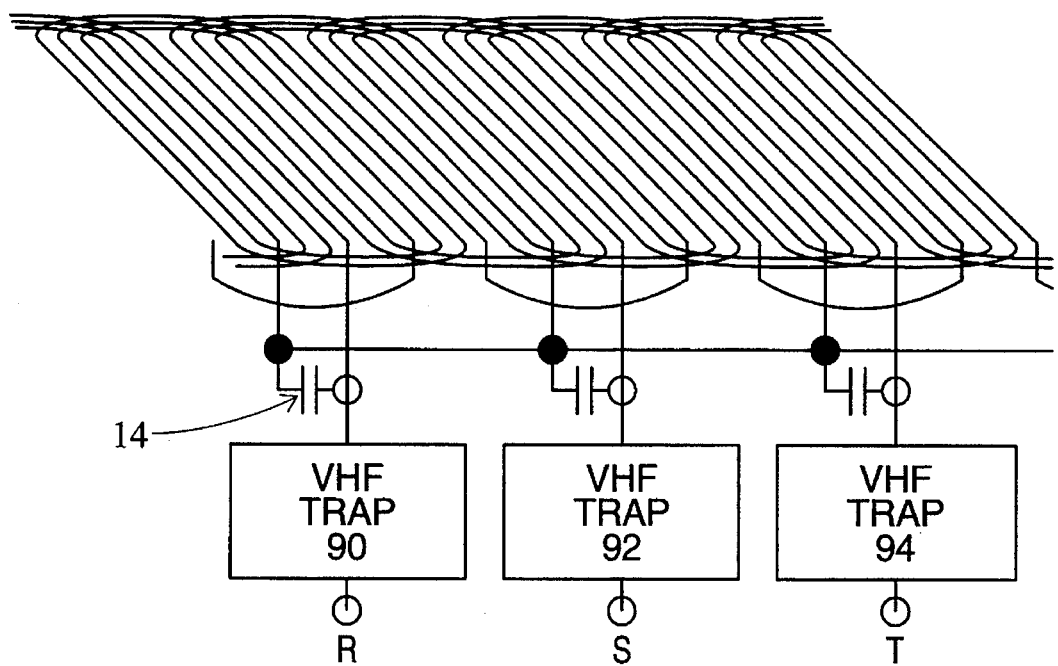
FIG. 3 shows the unrolled NMR coil of the transducer of FIG. 2.

In FIG. 3 we show how the turns can be placed in a regular fashion with the same distance between all consecutive helical wire segments. In this way the amount of conductor close to the imaging volume can be large, which is good for the Q-value of the coil. Mechanically the coils are wound on a tube made of low loss plastic, like polyethylene. They are tuned to resonate at the NMR frequency using capacitors 14 of a few nanofarads, with trimmer capacitors in parallel for alignment (not shown).

Figure 4:
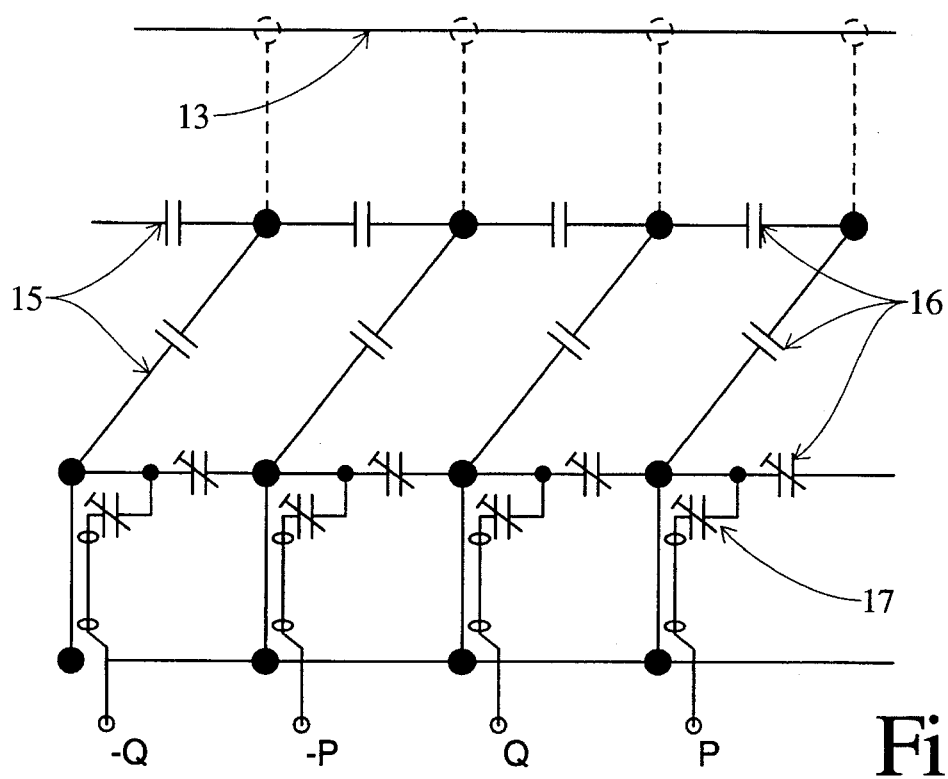
FIG. 4 shows the unrolled inner part of the VHF applicator of the transducer of FIG. 2.

The VHF applicator comprises an inner part 12 formed by conductors and capacitors, and an outer cylindrical casing 13, made of thin sheets of a good conductor, like copper. The inner part has a diameter of 23 cm and a length of 18 cm, the corresponding values for the casing are 50 cm and 30 cm. The casing has flat ends with holes in the middle for access. The inner part is shown in FIG. 4, with the cylindrical form unrolled. It is made of straight pieces of conductor, wire or strip, 15, and interconnected by capacitors 16. The capacitors must be rated for low loss and high voltage (500–1000 V) and they should have a value of 6–10 picofarads. One or two of the capacitors in each section should be of a variable type for final alignment of the resonant frequency. The described system uses four sections, spaced 90° apart (in a bigger system 6 sections spaced with 60° intervals might be appropriate). Each of them is fed with a VHF signal, the feed signals (P, Q, −P, −Q) having the same amplitude but phases increasing by 90° as going around the structure. Circuits for splitting the VHF power from a single feed line into four with appropriate phases are well known and can be bought from many vendors. Variable capacitors 17 are used to impedance match the split signals to the applicator. The four feed lines are preferably made of coaxial cable with the outer conductor made of solid copper tube. The structure can be made more symmetric with respect to the x-y plane by adding the dashed conductors (FIG. 4), this makes for a somewhat better design electrically but at the expense of increased complexity mechanically.

Figure 5:
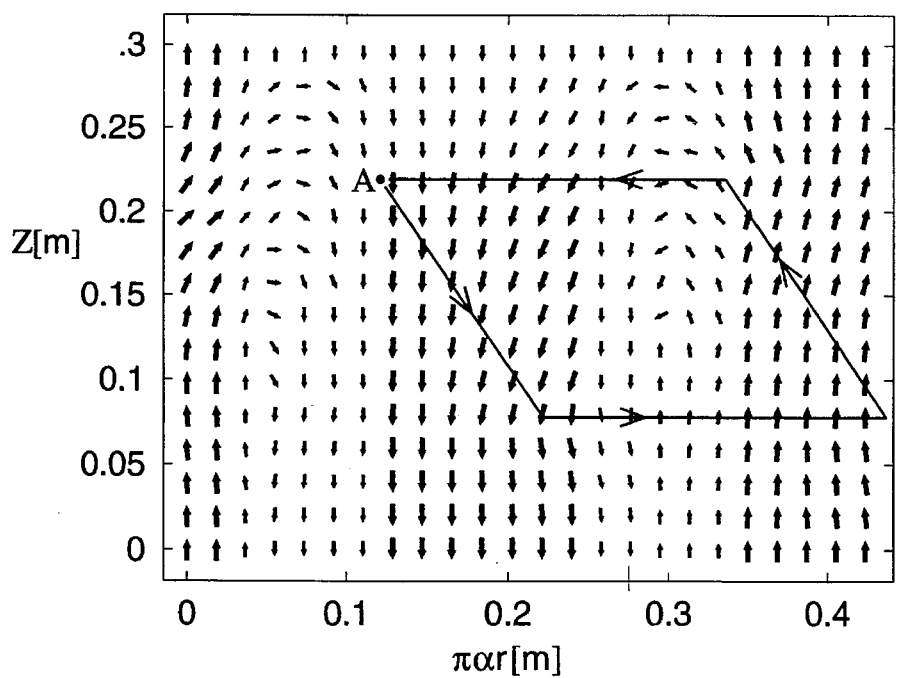
FIG. 5 shows the electric field produced by the VHF applicator of the transducer of FIG. 2.

The first tuning of the VHF applicator is preferably done without the RF coil, using a sweep oscillator to energize it and a VHF field probe to measure the magnetic field. The trimmer capacitors are tuned to maximize it at the desired frequency. The applicator will then have two resonant modes producing mutually orthogonal fields, which add vectorially to a rotating one when the resonances are in quadrature (have 90° phase difference). The magnetic field in the volume reserved for the RF coil will be approximately helical and perpendicular to the applicator axis, with a magnitude constant within 10%. The corresponding electric field, which is induced by the time variation of the magnetic one, is also rotating. Its z and o components are shown in FIG. 5 for some arbitrary time.

The Figure corresponds to the same unfolded cylinder as in FIG. 3, thus it is the field acting on the RF coil. It has been numerically calculated from the source currents flowing in the applicator, again in the absence of the RF coil. It has also been measured experimentally, with a similar result.

The function of the transducer can be understood with the aid of the following theoretical discussion:

We first define the magnetic flux induced into the RF coil by the VHF transducer in the following way: Choose some point on the RF coil, for instance the one designated "A" in FIG. 5. Make a line integral of the electric field along a closed path, going down a helical turn of the coil, then 180° along a circle, then up a helical turn, and finally along a circle back to the starting point. The integral is made along the RF coil wires and the result is a voltage which is equal to the angular frequency $W_{VHF}$ times the magnetic flux $\phi$ passing through the integral path. The position of "A" should be chosen to maximize $\phi$. The mutual inductance between the VHF applicator and the RF coil can be defined as $M=\phi/I_{VHF}$, where $I_{VHF}$ is the current in the former. (We can already anticipate from the figure, that the system has been made to minimize M.) We furthermore define the RF coil inductance in a similar way: First the electric field is computed as produced by a source current in the coil. This current will have the same magnitude in all the helical turns, but different phase angles. The phase angle in each turn will namely be equal to the spatial angle designating its position. Doing the same line integral we can compute the magnetic flux produced by the coil itself, and dividing by the current we obtain the RF coil inductance L for the chosen VHF mode (it is naturally different from the inductance defined for the RF signals).

We next define the efficiency of the VHF transducer as $K_{VHF}=B_{VHF}/I_{VHF}$, the field produced in the center by one ampere of current, and similarly $K_{RF}$ for the coil. As we place the RF coil inside the applicator, which produces the field $B_{VHF}$, it will obtain an induced current whose magnitude is such as to give a voltage to precisely cancel the induced one, $I=I_{VHF} M/L$. This current will in turn, give an extra VHF field, which in general tends to counteract the original one, and is proportional to it. The constant of proportionality is called the shield factor S. and is equal to $S=MK_{RF}/LK_{VHF}$.

The obtained field of the complete transducer will thus be reduced to $B_2=(1-S)B_{VHF}$. Our theoretical discussion thus tells us that the RF coil tends to develop a shielding current which decreases the VHF field $B_2$ obtained inside.

The arguments given above are simple, in that we have treated only one mode of VHF current distribution on the RF coil. As the structures are made larger phase differences begin to appear, this is first seen as an imaginary contribution in S. For still larger cases we can obtain spurious resonances in the RF coil structure. At this point the theory starts to become insufficient, because the chosen current distribution cannot represent these modes. They produce, however, fields which are nonhomogeneous and have a relatively large electric field component, thus they should be suppressed as much as possible. Ideally they would not be excited if the electric field of the applicator would be normal to the RF coil turns everywhere. In practice this can be accomplished only approximately. Additional help can be obtained by adding structures which couple to the spurious modes to shift their resonance frequency and/or damp them.

What is needed is thus a way to avoid, or at least greatly reduce, the shielding of $B_{VHF}$. The present invention discloses how to do this by making M small. This is accomplished by shaping the VHF transducer to give a helical field in the region filled by the RF coil, which in turn is shaped into another helix but with the opposite handedness. At the ends of the RF coil the applicator field helicity ends to make the electric field substantially perpendicular to the coil turns in this region (i.e. at the RF coil ends).

Stated in another way the invention teaches how to make an efficient OMRI transducer, consisting of a VHF applicator and an RF coil inside it, where the shielding of the applicator magnetic field by the coil is minimized by arranging the field to be everywhere substantially perpendicular to the coil turns. This is accomplished by shaping the applicator field into a helix over the coil, and the coil to a helix with the opposite handedness.

The presented example of a transducer is only one way of applying the invention. The applicator can be made in a number of ways to produce a field with the appropriate shape. It can for instance be made of a number of similar elements which have an electromagnetic resonance mode whose magnetic field couples to the desired volume. These elements are arranged in spirals or otherwise to form an electric periodic structure, as described in the cited previous application by the same inventor.

A point which was mentioned before was the decoupling of the leads from the RF coil. Looking at FIG. 3 we realize that, unless inductive coupling to another coil is used (which can be appropriate in some cases), we have to connect leads to the terminals R. S. and T. From FIG. 5 we see that if we pass the leads in the axial direction to the end plane of the transducer a sizeable VHF voltage will be induced because the electric field is here almost axial. To avoid a current flowing we can use a VHF trap. A preferred construction for such a trap is formed by a so called quarter wavelength dielectric resonator. This comprises a cylindrical piece of a substance with a high dielectric constant, for instance 80, with a hole in the center along its axis. The cylinder is silverplated both inside and outside, leaving one end free, to form a piece of coaxial transmission line with length equal to one quarter of a wavelength inside the material, typically 7 cm or thereabouts. Such resonators are used for making filters and they have Q-values going up to one thousand or more. The leads connecting the RF coil to the outside of the transducer can conveniently be decoupled by slipping each of them through the hole of a dielectric resonator 90, 92, 94 and connecting it to the silver plating of that hole at the open end of the resonator. The result is that the lead seems open for the VHF signal but is unaffected at the RF frequency.

I claim:

1. An OMRI volume transducer, comprising:
    a VHF applicator adapted for use at a frequency associated with an ESR signal; and
    an RF coil disposed inside the applicator and adapted for use at a frequency associated with an MR signal, wherein the applicator and coil are arranged such that an electric field provided by the applicator in use is substantially perpendicular to the coil.

2. The transducer of claim 1 wherein the VHF applicator is shaped to give a helical electric field in the region filled by the RF coil, and the RF coil is arranged to be a helix of the opposite handedness.

3. The transducer of claim 2 wherein the applicator electric field helicity substantially ends at the ends of the RF coil, whereby the electrical field is substantially perpendicular to the coil turns at the ends of the RF coil.

4. The transducer of claim 2 wherein the RF coil is arranged such that consecutive helical segments of the RF coil are spaced equally.

5. The transducer of claim 2 wherein the VHF applicator comprises a number of similar elements having an electromagnetic resonance mode whose magnetic field couples to the desired volume.

6. The transducer of claim 5 wherein the elements are arranged to form an electrical periodic structure.

7. The transducer of claim 6 wherein the elements are arranged in spirals.

8. The transducer of claim 1 further comprising means for coupling to spurious resonances to shift their resonance frequency.

9. An apparatus for Overhauser magnetic resonance imaging comprising:
    means for producing a constant magnetic field B in an imaging volume;
    means for producing a time varying gradient field in said imaging volume;
    means for transmitting signals into said imaging volume at a nuclear magnetic resonance (NMR) frequency, said NMR transmitting means including an RF volume coil adapted for use at an NMR frequency;
    means for transmitting signals into said imaging volume at an electron spin resonance (ESR) frequency, said ESR transmitting means including a VHF volume applicator adapted for use at an ESR frequency;
    means for operating the NMR transmitting means, the ESR transmitting means and the means for producing the gradient field to transmit the NMR and ESR signals and to vary the gradient field in said imaging volume; and
    means for receiving NMR signals from said imaging volume, wherein the VHF applicator and RF coil are arranged such that the electric field provided by the applicator in use is substantially perpendicular to the coil.

10. The apparatus of claim 9 wherein the RF coil of the NMR transmitting means is also used by the means for receiving NMR signals to receive NMR signals from the imaging volume.

11. The apparatus of claim 10, wherein the RF coil is coupled to the means for receiving NMR signals via a VHF trap.

12. The apparatus of claim 11, wherein said VHF trap comprises a quarter wavelength dielectric resonator.

13. The apparatus of claim 9 wherein the VHF applicator is shaped such that the applicator produces a helical electric field in the region filled by the RF coil and the RF coil is arranged to be a helix of the opposite handedness.

14. The transducer of claim 13 wherein the helical electric field of the applicator substantially ends at the ends of the RF coil and the electrical field is substantially perpendicular to the coil at the ends of the RF coil.

15. The transducer of claim 13 wherein the RF coil is arranged such that consecutive helical segments of the RF coil are spaced equally.

16. The transducer of claim 13 wherein the VHF applicator comprises a number of similar elements having an electromagnetic resonance mode whose magnetic field couples to an imaging volume disposed inside the RF coil.

17. The transducer of claim 16 wherein the elements are arranged to form an electrical periodic structure.

18. The transducer of claim 17 wherein the elements are arranged in spirals.

19. The transducer of claim 9 further comprising means to couple to spurious resonances to shift their resonance frequency and/or damp them.

20. The transducer of claim 1 further comprising means for coupling to spurious resonances to damp them.

* * * * *